US011976362B2

(12) United States Patent
Asano

(10) Patent No.: US 11,976,362 B2
(45) Date of Patent: May 7, 2024

(54) SUBSTRATE PROCESSING APPARATUS AND METHOD FOR MANUFACTURING SEMICONDUCTOR DEVICE

(71) Applicant: Kioxia Corporation, Tokyo (JP)

(72) Inventor: Takashi Asano, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 267 days.

(21) Appl. No.: 17/462,673

(22) Filed: Aug. 31, 2021

(65) Prior Publication Data
US 2022/0081772 A1 Mar. 17, 2022

(30) Foreign Application Priority Data
Sep. 14, 2020 (JP) ................................. 2020-153458

(51) Int. Cl.
*C23C 16/455* (2006.01)
*C23C 16/34* (2006.01)
*C23C 16/40* (2006.01)
*C23C 16/458* (2006.01)
*H01L 21/02* (2006.01)

(52) U.S. Cl.
CPC ...... *C23C 16/45578* (2013.01); *C23C 16/345* (2013.01); *C23C 16/401* (2013.01); *C23C 16/45546* (2013.01); *C23C 16/4584* (2013.01); *H01L 21/02164* (2013.01); *H01L 21/0217* (2013.01); *H01L 21/02178* (2013.01); *H01L 21/0228* (2013.01)

(58) Field of Classification Search
CPC ..................... C23C 16/45578; C23C 16/4408
See application file for complete search history.

(56) References Cited

U.S. PATENT DOCUMENTS

| 9,412,582 B2 | 8/2016 | Sasaki et al. |
| 10,475,641 B2 | 11/2019 | Fukushima et al. |
| 2010/0083898 A1* | 4/2010 | Kogura ............. C23C 16/45546 |
| | | 118/692 |
| 2015/0144060 A1* | 5/2015 | Park .................. H01L 21/67109 |
| | | 414/226.05 |
| 2018/0076021 A1* | 3/2018 | Fukushima ....... H01L 21/67109 |

FOREIGN PATENT DOCUMENTS

| JP | 5284182 B2 | 9/2013 |
| JP | 2015-183224 A | 10/2015 |
| JP | 2018-046114 A | 3/2018 |

\* cited by examiner

*Primary Examiner* — Michael Carter
*Assistant Examiner* — Lawrence C Tynes, Jr.
(74) *Attorney, Agent, or Firm* — Foley & Lardner LLP

(57) ABSTRACT

According to one embodiment, a substrate processing apparatus includes: an inner tube extending in a first direction and configured to accommodate a plurality of substrates; an outer tube configured to surround the inner tube and provide an airtight sealed space; a nozzle disposed in the inner tube; a gas supply configured to supply a processing gas to the inner tube via the nozzle; at least one slit provided on a side surface of the inner tube facing the nozzle; and an exhaust port coupled to the outer tube. Along the first direction, an opening area of a central portion of the slit is larger than an opening area of end portions of the slit.

16 Claims, 7 Drawing Sheets

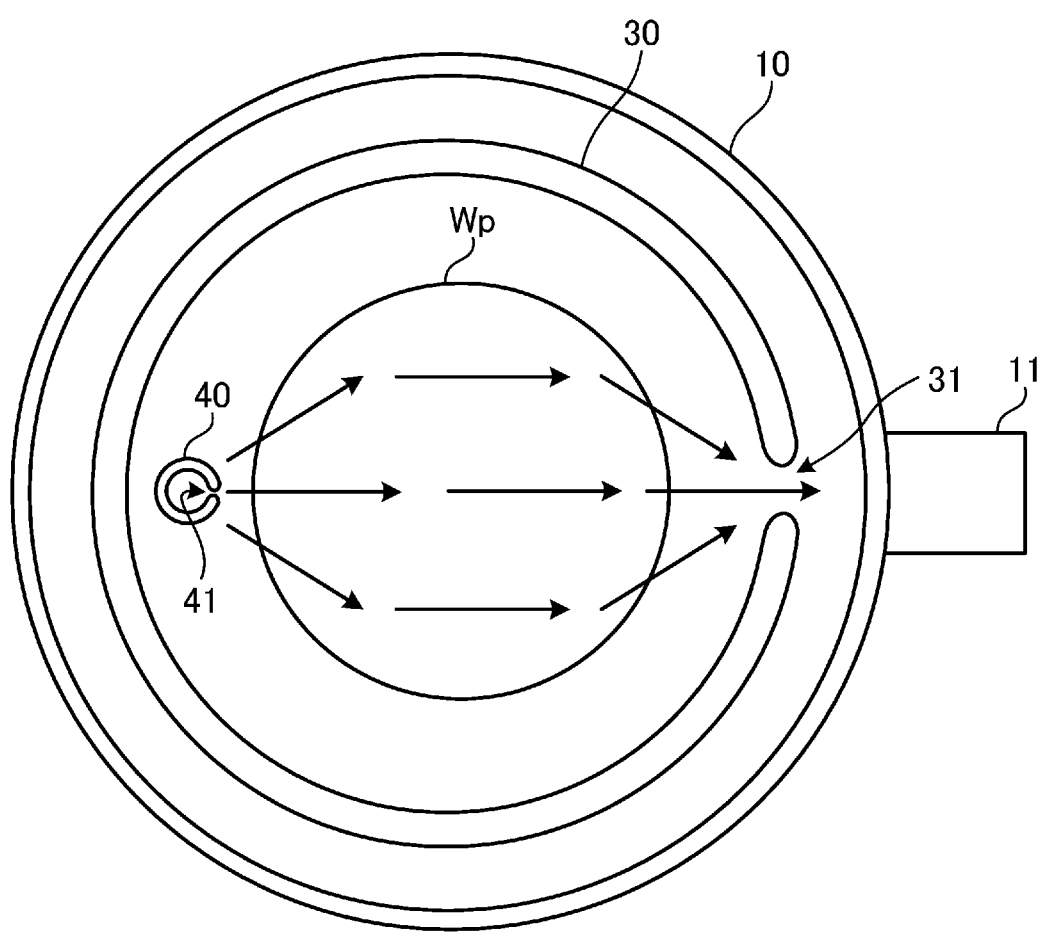

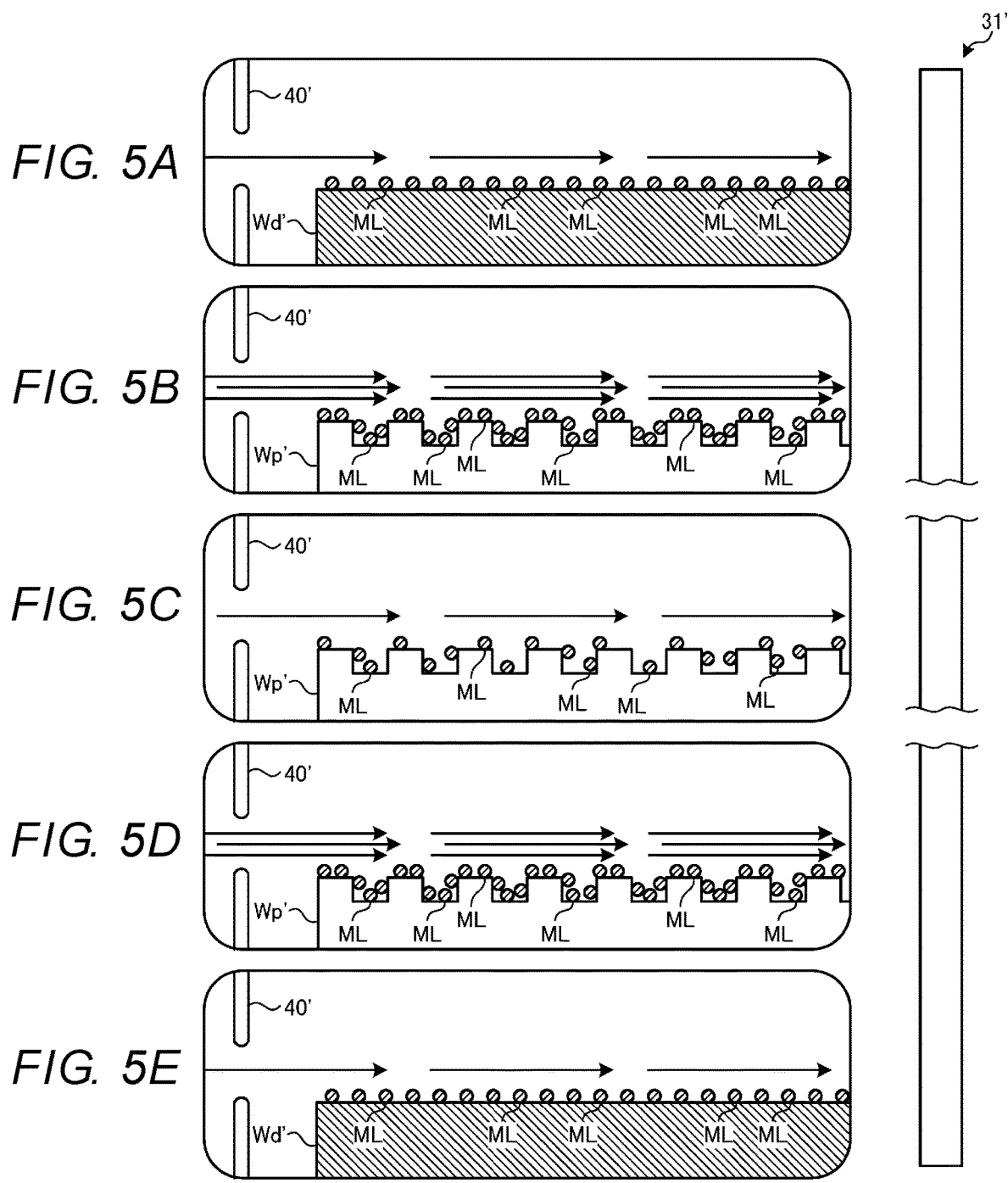

SUBSTRATE PROCESSING APPARATUS AND METHOD FOR MANUFACTURING SEMICONDUCTOR DEVICE

CROSS-REFERENCE TO RELATED APPLICATION

This application is based upon and claims the benefit of priority from Japanese Patent Application No. 2020-153458, filed Sep. 14, 2020, the entire contents of which are incorporated herein by reference.

FIELD

Embodiments described herein relate generally to a substrate processing apparatus and a method for manufacturing a semiconductor device.

BACKGROUND

A substrate processing apparatus may form a film on a processing substrate by supplying a processing gas from one side into a tube in which a plurality of processing substrates are arranged in parallel and accommodated and allowing the processing gas to pass through the processing substrates and to be exhausted from the other side. Dummy substrates are disposed inside the tube at both end portions of a plurality of the processing substrates.

However, sometimes, among the plurality of processing substrates, the film thickness of the film on the processing substrate located in the vicinity of both end portions of the array may be larger than the film thickness of the film on the processing substrate located in the central vicinity of the array.

DESCRIPTION OF THE DRAWINGS

FIG. 2 is a transverse cross-sectional view illustrating an example of the configuration of the substrate processing apparatus according to the embodiment.

FIGS. 5A to 5E are schematic views illustrating a state of a film formation process in a substrate processing apparatus according to a comparative example.

DETAILED DESCRIPTION

Embodiments provide a substrate processing apparatus and a method for manufacturing a semiconductor device capable of improving film thickness uniformity between processing substrates of predetermined films formed on the processing substrates.

In general, according to one embodiment, there is provided a substrate processing apparatus including: an inner tube extending in a first direction and configured to accommodate a plurality of substrates; an outer tube configured to surround the inner tube and provide an airtight sealed space; a nozzle disposed in the inner tube; a gas supply configured to supply a processing gas to the inner tube via the nozzle; at least one slit provided on a side surface of the inner tube facing the nozzle; and an exhaust port coupled to the outer tube. Along the first direction, an opening area of a central portion of the slit is larger than an opening area of end portions of the slit.

Hereinafter, embodiments will be described in detail with reference to the drawings. It is noted that the present disclosure is not limited to the following embodiments. In addition, components in the following embodiments include components that can be easily conceived by those skilled in the art or components that are substantially the same.

Configuration Example of Substrate Processing Apparatus

Figure 1:
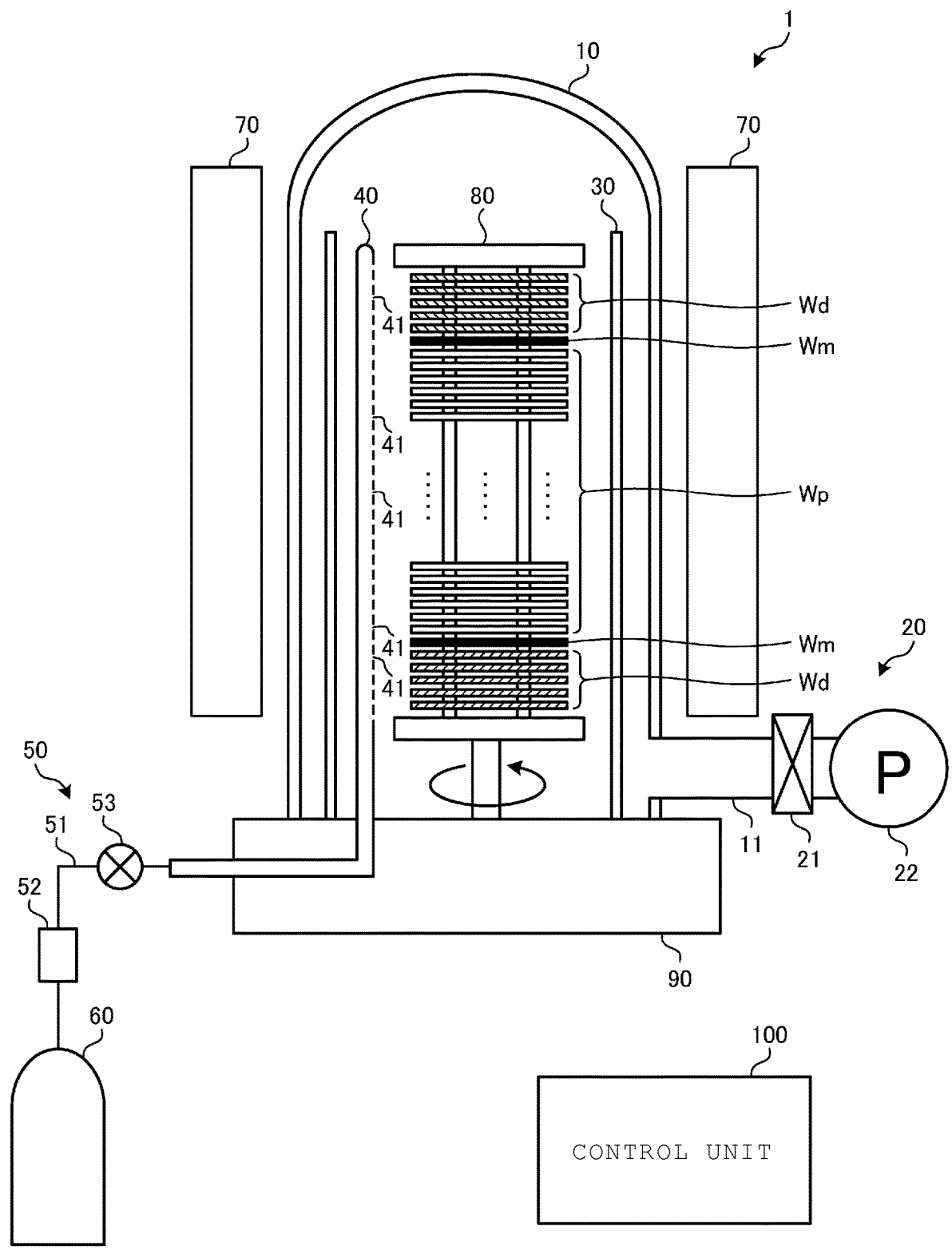
FIG. 1 is a diagram illustrating an example of a configuration of a substrate processing apparatus according to an embodiment.

FIG. 1 is a diagram illustrating an example of a configuration of a substrate processing apparatus 1 according to an embodiment. As illustrated in FIG. 1, the substrate processing apparatus 1 includes an outer tube 10, a gas exhaust unit 20, an inner tube 30, a nozzle 40, a gas supply unit 50, a heating unit 70, a boat 80, a base 90, and a control unit 100.

The outer tube 10 is a cylindrical tube made of, for example, quartz and stretching in a vertical direction. The upper end of the outer tube 10 is closed, and the lower end is open. The open lower end of the outer tube 10 is disposed on the base 90, and the outer tube 10 is configured so as to airtightly seal the inside. An exhaust port 11 is provided near the lower end portion of the outer tube 10.

The gas exhaust unit 20 is connected to the exhaust port 11 of the outer tube 10. The gas exhaust unit 20 includes a valve 21 and a pump 22. The valve 21 is disposed closer to the outer tube 10 upstream of the pump 22 and is a valve such as a butterfly valve of which opening degree can be adjusted. By adjusting the opening degree of the valve 21 while driving the pump 22 downstream of the valve 21, the atmosphere inside the outer tube 10 can be exhausted, and the pressure inside the outer tube 10 can be adjusted to a desired pressure.

The heating unit 70 surrounds the outer periphery of the side surface of the outer tube 10. The heating unit 70 is, for example, a heater or the like and heats a processing substrate Wp accommodated in the inner tube 30 to a desired temperature.

The inner tube 30 is disposed inside the outer tube 10. The inner tube 30 is a cylindrical tube made of, for example, quartz or the like and having open upper and lower ends. The open lower end of the inner tube 30 is disposed on the base 90. The inner tube 30 is configured to be capable of accommodating the processing substrate Wp which is a target of the film formation process. The processing substrate Wp is a substrate during manufacturing a semiconductor device, and a predetermined pattern having irregularities on the surface of the substrate is formed, for example, by the manufacturing process up to that point.

The boat 80 made of, for example, quartz or the like and capable of accommodating a plurality of processing substrates Wp is accommodated inside the inner tube 30. The boat 80 can accommodate the plurality of processing substrates Wp in parallel along the stretching direction of the inner tube 30 and can accommodate dummy substrates Wd at the upper and lower ends of an array of the plurality of processing substrates Wp. The dummy substrate Wd is a substrate having a substantially flat surface such as a bare silicon substrate, and the dummy substrates are disposed at both end portions of the plurality of processing substrates Wp in order to improve heat uniformity in the plurality of processing substrates Wp.

A monitor substrate Wm may be disposed between the plurality of processing substrates Wp and the dummy substrates Wd at the upper and lower ends. The monitor substrate Wm is a substrate for monitoring whether or not the plurality of processing substrates Wp are properly processed by measuring the number of particles on the monitor substrate Wm or the film thickness of the predetermined film formed on the monitor substrate Wm.

The boat 80 is carried into the inner tube 30 by a transport system (not illustrated) and is configured to be rotatable in the inner tube 30 by a motor or the like (not illustrated) disposed at the base 90.

The nozzle 40 is disposed inside the inner tube 30 at a position facing the exhaust port 11 of the outer tube 10. The nozzle 40 extends to the inner tube 30 via, for example, the base 90 below the inner tube 30, is stretched from the upper end to the lower end of the inner tube 30, and has a shape in which the lower end is bent in an L shape. The nozzle 40 is configured as a multi-holed nozzle having a large number of holes 41 on the side surface of the nozzle 40 along the stretching direction. Each of the plurality of holes 41 of the nozzle 40 is disposed corresponding to each of the height positions of the plurality of processing substrates Wp accommodated in the boat 80.

The gas supply unit 50 is connected to the L-shaped lower end portion of the nozzle 40. The gas supply unit 50 includes a gas supply pipe 51, a mass flow controller 52, and a valve 53.

The upstream end of the gas supply pipe 51 is connected to a gas cylinder 60 as a supply source of the processing gas for processing the processing substrate Wp, and the downstream end of the gas supply pipe 51 is connected to the downstream end of the nozzle 40. The processing gas is a raw material gas for the predetermined film formed on the processing substrate Wp. The processing gas is supplied to the processing substrate Wp in the inner tube 30 through the plurality of holes 41 of the nozzle 40, so that a predetermined film such as an AlN film, an $Al_2O_3$ film, or a silicon-based film is formed on the processing substrate Wp.

It is noted that a plurality of types of processing gases may be used to form the predetermined film. For example, in order to form an AlN film, an $Al_2O_3$ film, or the like, a tri-methyl-aluminum (TMA) gas which is a raw material gas for Al, a $N_2$ gas as a nitride gas, an $O_2$ gas as an oxidation gas, or the like is used. In addition, in order to form a silicon-based film, a silane ($SiH_4$) gas which is a raw material gas for Si is used together with a nitride gas, an oxidation gas, and the like.

Therefore, the substrate processing apparatus 1 may include a plurality of sets of the nozzle 40 and the gas supply unit 50 for each of the various gases that may be used by the substrate processing apparatus 1.

The processing gas supplied from the nozzle 40 onto the processing substrate Wp is discharged to the outside of the inner tube 30 from the slit which is on the side surface of the inner tube 30 and provided on the same side as the exhaust port 11 of the outer tube 10 and is exhausted to the outside of the substrate processing apparatus 1 through the exhaust port 11 of the outer tube 10. The slit on the side surface of the inner tube 30 will be described later.

The mass flow controller 52 and the valve 53 are provided in the gas supply pipe 51 in order from the upstream side. The mass flow controller 52 adjusts a flow rate of the processing gas flowing out from the gas cylinder 60. By opening or closing the valve 53, the supply of the processing gas to the inner tube 30 is started or stopped.

The control unit 100 includes, for example, a central processing unit (CPU), a read only memory (ROM), a random access memory (RAM), and the like and is configured as a computer that controls the entire substrate processing apparatus 1.

That is, the control unit 100 controls the valves 21 and 53, the pump 22, the mass flow controller 52, the heating unit 70, the motor (not illustrated) for rotating the boat 80, the transport system, and the like.

More specifically, the control unit 100 allows the boat 80 in which the plurality of processing substrates Wp, the dummy substrate Wd, the monitor substrate Wm, and the like are loaded in multiple stages by a transport system (not illustrated) to be accommodated in the inner tube 30 and allows the boat 80 in the inner tube 30 to rotate by a motor (not illustrated). In addition, the control unit 100 controls the heating unit 70 to heat the processing substrate Wp, the dummy substrate Wd, and the monitor substrate Wm in the inner tube 30 to a desired temperature.

In addition, the control unit 100 opens the valve 53 while controlling the flow rate by using the mass flow controller 52 and allows the processing gas to be supplied into the inner tube 30 via the nozzle 40. In addition, the control unit 100 sets the pressure inside the outer tube 10 to a desired pressure by adjusting the opening degree of the valve 21 while driving the pump 22.

Accordingly, the processing gases are supplied to the respective surfaces of the plurality of processing substrates Wp in a state where the plurality of processing substrates Wp accommodated in the inner tube 30 are heated to a desired temperature. When the processing gas comes into contact with the surface of the processing substrate Wp heated to a desired temperature, the processing gas is decomposed by a thermochemical reaction. In addition, the constituents configuring the predetermined film generated by the decomposition of the processing gas are deposited on the surface of the processing substrate Wp at the level of one molecule to several molecules. Therefore, the predetermined films are formed on the respective surfaces of the plurality of processing substrates Wp.

As described above, the substrate processing apparatus 1 according to the embodiment is configured as, for example, a vertical type furnace capable of forming a predetermined film and, more specifically, for example, as an atomic layer deposition (ALD) apparatus.

Configuration Example of Slit

Next, a slit 31 provided in the inner tube 30 of the embodiment will be described with reference to FIGS. 2 and 3A to 3C. FIG. 2 is a transverse cross-sectional view illustrating an example of the configuration of the substrate processing apparatus 1 according to the embodiment. In FIG. 2, a flow path of the processing gas in the inner tube 30 is indicated by an arrow.

As illustrated in FIG. 2, the inner tube 30 is provided with the slit 31 on the side surface of the inner tube 30 facing the nozzle 40 and on the same side as the side where the exhaust port 11 of the outer tube 10 is provided.

With such a disposition, the processing gas introduced into the inner tube 30 is supplied onto each of the surfaces of the plurality of processing substrates Wp from each hole 41 of the nozzle 40 provided in the inner tube 30. The processing gas is diffused over the entire surface of the processing substrate Wp and is finally discharged to the outside of the inner tube 30 from the slit 31 provided on the opposite side of the nozzle 40 to be exhausted from the exhaust port 11 at the lower end of the outer tube 10 to the outside of the substrate processing apparatus 1.

Figure 3A:
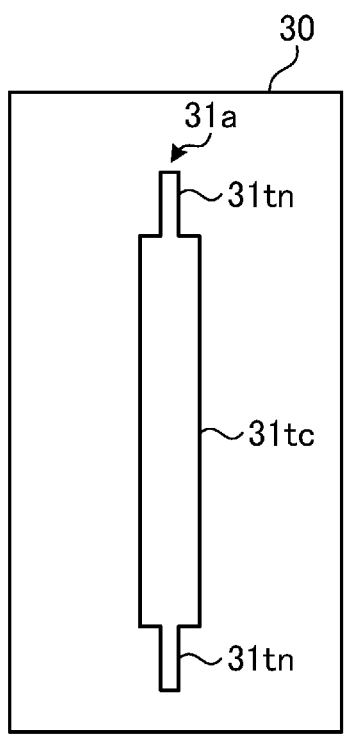
FIGS. 3A to 3C are diagrams illustrating configuration examples of a slit provided in an inner tube of the substrate processing apparatus according to the embodiment.
Figure 3B:
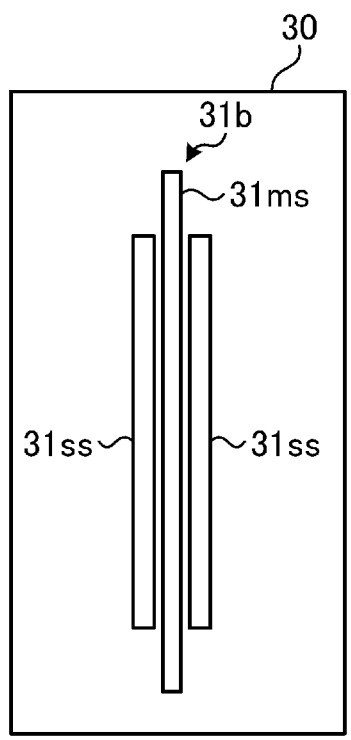
Figure 3C:
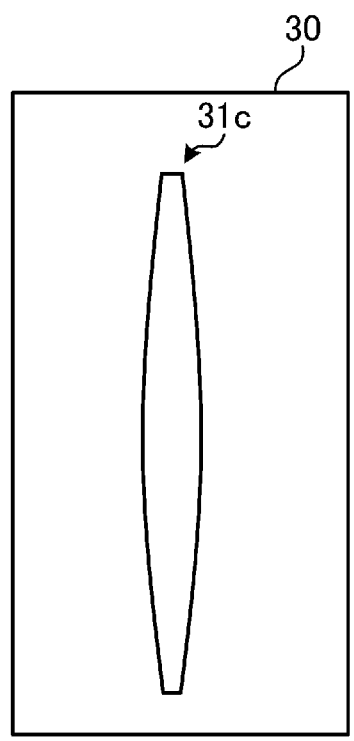

FIGS. 3A to 3C are diagrams illustrating configuration examples of the slit 31 included in the inner tube 30 of the substrate processing apparatus 1 according to the embodiment. FIGS. 3A to 3C illustrate some configuration examples of the slit 31.

As illustrated in FIGS. 3A to 3C, in each of the examples, the slit 31 is provided so as to be extended in the stretching direction of the inner tube 30. More specifically, the upper end of the slit 31 reaches at least the height position of the dummy substrate Wd on the uppermost stage loaded on the boat 80, and the lower end of the slit 31 reaches at least the height position of the dummy substrate Wd on the lowermost stage loaded on the boat 80. In addition, the slit 31 is configured so that the opening area in the central portion of the slit 31 in the stretching direction is larger than the opening area at both end portions of the slit 31 in the stretching direction.

In the example of FIG. 3A, a slit 31a has different widths in the directions orthogonal to the stretching direction of the slit 31a. That is, the width at the central portion of the slit 31a in the stretching direction is larger than the widths at both end portions of the slit 31a in the stretching direction. More specifically, the slit 31a has end slits 31tn having a predetermined width at the upper and lower ends and a central slit 31tc at the central portion interposed between the end slits 31tn and having a width larger than that of the end slit 31tn. Alternatively stated, the central portion of the slit 31a and at least one of the end portions of the slit 31a may present a step profile.

In the example of FIG. 3B, a slit 31b includes a main slit 31ms extending over the stretching direction of the inner tube 30 and a sub slit 31ss extending in the vicinity of the central portion in the stretching direction of the inner tube 30. The sub slits 31ss are disposed, for example, on both sides of the main slit 31ms in the short direction along the stretching direction of the main slit 31ms.

In the example of FIG. 3C, similarly to the slit 31a of FIG. 3A, a width of a slit 31c at a central portion in the stretching direction is larger than the width at both end portions. However, in the slit 31c, the width gradually and gently changes in the stretching direction of the slit 31c. Alternatively stated, the central portion of the slit 31c and at least one of the end portions of the slit 31c may present a curvature profile.

Method for Manufacturing Semiconductor Device

Next, a method of forming a predetermined film FL on the processing substrate Wp by using the substrate processing apparatus 1 according to the embodiment will be described with reference to FIGS. 4A to 4D. The formation of the predetermined film FL on the processing substrate Wp by the substrate processing apparatus 1 is performed as a part of the method for manufacturing the semiconductor device.

FIGS. 4A to 4D are schematic views illustrating a state in which the predetermined film FL is formed on the processing substrate Wp in the substrate processing apparatus 1 according to the embodiment.

FIGS. 4A to 4D illustrate a state in which, for example, the boat 80 in which the dummy substrates Wd are disposed at the upper and lower ends via the monitor substrate Wm and the plurality of processing substrates Wp are loaded in multiple stages is rotated in the inner tube 30. In addition, the plurality of processing substrates Wp are heated to a desired temperature by the heating unit 70. At this time, the heat uniformity over the entire plurality of processing substrates Wp is maintained by the dummy substrates Wd disposed at the upper and lower ends. It is noted that the arrows in FIGS. 4A to 4C indicate the flow of the processing gas.

Figure 4A:
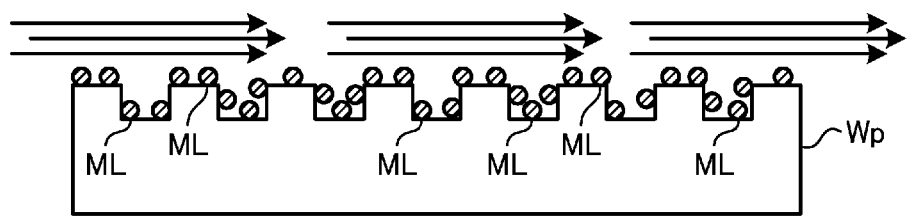
FIGS. 4A to 4D are schematic views illustrating a state in which a predetermined film is formed on a processing substrate in the substrate processing apparatus according to the embodiment.

As illustrated in FIG. 4A, the processing gas introduced from the nozzle 40 into the inner tube 30 is drawn toward the slit 31 side of the inner tube 30. Since each of the plurality of holes 41 of the nozzle 40 is provided at the height position of the plurality of processing substrates Wp, the processing gas passes on the surface of each processing substrate Wp. At this time, the processing gas in contact with the surface of the processing substrate Wp is decomposed by the heat of the processing substrate Wp heated to a predetermined temperature and deposited on the surface of the processing substrate Wp at the level of one molecule to several molecules.

The processing substrate Wp has, for example, a pattern including irregularities formed in the manufacturing process up to that point. Molecules ML of the thermally decomposed processing gas are deposited along the irregularities of the surface on the processing substrate Wp.

Figure 4B:
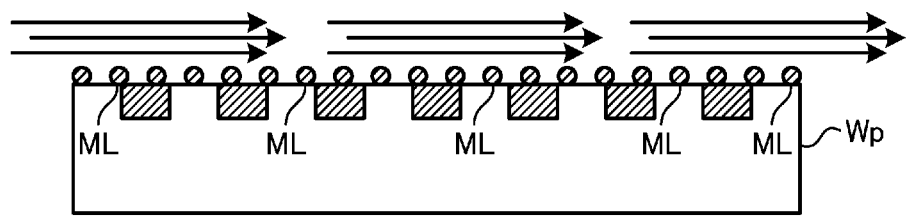
Figure 4C:
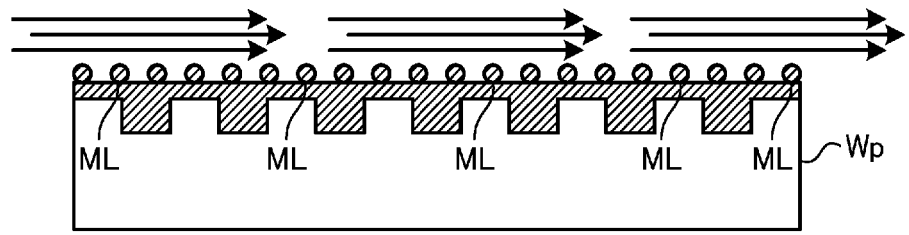

As illustrated in FIGS. 4B and 4C, the molecules ML of the processing gas are deposited on the processing substrate Wp to increase the thickness while burying the irregularities on the surface of the processing substrate Wp.

Figure 4D:
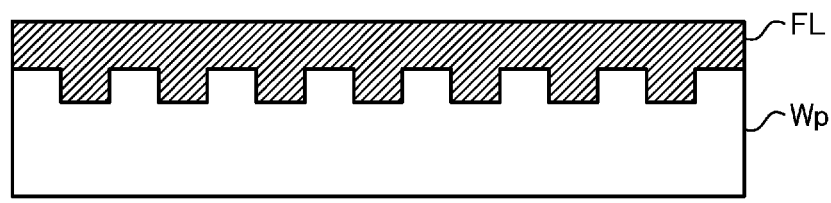

As illustrated in FIG. 4D, by continuously supplying the processing gas to the processing substrate Wp for a predetermined time, the predetermined film FL having a desired film thickness is formed.

As described above, after the processing in the substrate processing apparatus 1 is ended, various processes are further performed on the processing substrate Wp to manufacture the semiconductor device including the predetermined film FL as a portion. The predetermined film FL such as an AlN film, an $Al_2O_3$ film, or a silicon-based film is used as a portion of, for example, a metal-oxide-nitride-oxide-silicon (MONOS) structure or a metal-alumina-nitride-oxide-silicon (MANOS) structure. The MONOS and MANOS structures may be applied, for example, as memory cells that retain memory.

Comparative Example

In a manufacturing process of a semiconductor device, sometimes, a process of forming a predetermined film by loading a plurality of processing substrates in multiple stages on a substrate processing apparatus including an inner tube and an outer tube may be performed. In such a substrate processing apparatus, sometimes, for example, the film thickness of the predetermined film formed on the processing substrate may increase in the vicinity of the exhaust port provided on the outer tube. Therefore, various measures are taken in order to improve film thickness uniformity between the plurality of processing substrates loaded in the inner tube. The film thickness uniformity between the plurality of processing substrates is also referred to as in-furnace uniformity.

However, the present inventor found out that, even after taking the measures for improving the in-furnace uniformity as described above, the film thickness uniformity of the predetermined film between the plurality of processing substrates may increase. Among the plurality of processing substrates, the film thickness of the predetermined film in the processing substrate disposed in the central vicinity of the boat is further reduced than that in the processing substrates at the upper and lower ends disposed in the vicinity of the dummy substrate.

As a result of diligent research, the present inventor found out that the increase in in-furnace uniformity described above can be caused by the difference in surface area between the processing substrate and the dummy substrate. Furthermore, a method to prevent the increase in in-furnace uniformity due to such a difference in surface area is conceived. This point will be described with reference to FIGS. 5A to 7.

FIGS. 5A to 5E are schematic views illustrating a state of a film formation process in the substrate processing apparatus according to the comparative example.

FIGS. 5A to 5E illustrate a state in which, for example, the boat in which dummy substrates Wd' are disposed at the upper and lower ends via the monitor substrate (not illustrated) and a plurality of processing substrates Wp' are loaded is rotated in the inner tube. A slit 31' having an equal width over the entire stretching direction is provided in the side wall of the inner tube of the comparative example. In addition, the plurality of processing substrates Wp' are heated to a desired temperature by a heating unit (not illustrated). It is noted that the arrows in FIGS. 5A to 5E indicate the flow of the processing gas from a nozzle 40'.

FIG. 5A illustrates the state of the dummy substrate Wd' disposed at the uppermost stage of the boat in the inner tube during the substrate processing.

As illustrated in FIG. 5A, the dummy substrate Wd' is, for example, a substrate having no pattern on the surface and having a substantially flat surface. Therefore, the surface area of the dummy substrate Wd' is relatively small, and the consumed amount of the processing gas due to the contact with the dummy substrate Wd' and the decomposition is relatively small.

FIG. 5B illustrates the state of the processing substrate Wp' disposed at the uppermost stage among the plurality of processing substrates Wp' in the inner tube during the substrate processing.

That is, the plurality of dummy substrates Wd' are disposed above the processing substrate Wp' in FIG. 5B, for example, via the monitor substrate. As illustrated in FIG. 5B, the processing substrate Wp' has a pattern including irregularities formed in, for example, the manufacturing process up to that point.

As described above, the consumed amount of the processing gas by the substantially flat dummy substrate Wd' is small, and some of the surplus processing gas is supplied to, for example, the processing substrate Wp' side disposed in the vicinity of the dummy substrate Wd'. Accordingly, a large amount of processing gas can be supplied to the processing substrate Wp' in the vicinity of the dummy substrate Wd'. Therefore, a predetermined film having a desired film thickness or more is formed on the processing substrate Wp'.

FIG. 5C illustrates the state of the processing substrate Wp' disposed in the central vicinity among the plurality of processing substrates Wp' in the inner tube during the substrate processing.

That is, other processing substrates Wp' are loaded in multiple stages in the vertical direction of the processing substrate Wp' in FIG. 5C. A pattern is formed on each of the processing substrates Wp', and the surface area is larger than that of the dummy substrate Wd described above.

Therefore, a large amount of processing gas is consumed in the processing substrate Wp' disposed in the central vicinity of the boat, and the processing gas supplied on each processing substrate Wp' is substantially consumed in each processing substrate Wp' without being supplied to other processing substrates Wp' side disposed in the vicinity. As a result, a predetermined film having a film thickness smaller than that on the processing substrate Wp' in FIG. 5B is formed on the processing substrate Wp' in the central vicinity of the boat.

FIG. 5D illustrates the state of the processing substrate Wp' disposed at the lowermost stage among the plurality of processing substrates Wp' in the inner tube during the substrate processing.

That is, the plurality of dummy substrates Wd' are disposed below the processing substrate Wp' in FIG. 5D via, for example, the monitor substrate, and the same phenomenon as the processing substrate Wp' in FIG. 5B described above occurs. That is, the surplus processing gas that is not consumed by the lower dummy substrate Wd' is supplied, and a predetermined film having a desired film thickness or more is formed on the processing substrate Wp'.

FIG. 5E illustrates the state of the dummy substrate Wd' disposed at the lowermost stage of the boat in the inner tube during the substrate processing.

As illustrated in FIG. 5E, the dummy substrate Wd' at the lowermost stage of the boat also has a surface which is substantially flat and has a small area, and the processing gas that is not consumed by the dummy substrate Wd' is supplied to the processing substrate Wp' side in the vicinity as described above.

The present inventor found out that the above-mentioned increase in in-furnace uniformity among the plurality of processing substrates in the substrate processing apparatus occurs by such a cause. In order to prevent the increase in in-furnace uniformity, the present inventor diligently studied a configuration for adjusting the balance of the supplied amounts of the processing gas in the plurality of processing substrates. As a result, the present inventor found out that the efficiency of supplying the processing gas to the processing substrate disposed in the vicinity of the central position of the boat can be improved by increasing the opening area of the slit corresponding to the vicinity of central position of the boat.

FIGS. 6A to 6E are schematic views illustrating a state of the film formation process in the substrate processing apparatus 1 according to the embodiment.

FIGS. 6A to 6E illustrate a state in which, for example, the boat 80 in which the dummy substrates Wd are disposed at the upper and lower ends via the monitor substrate Wm and the plurality of processing substrates Wp are loaded is rotated in the inner tube 30. For example, the slit 31a of FIG. 3A among the slits 31 illustrated in FIGS. 3A to 3C is assumed to be provided in the side wall of the inner tube 30. The plurality of processing substrates Wp are heated to a desired temperature by the heating unit 70. The arrows in FIGS. 6A to 6E indicate the flow of the processing gas from the nozzle 40.

In addition, the dummy substrate Wd and the processing substrate Wp illustrated in FIGS. 6A to 6E are disposed at positions corresponding to the dummy substrate Wd' and the processing substrate Wp' illustrated in FIGS. 5A to 5E described above. Of these, narrow end slits 31*tn* are disposed at the height positions of the dummy substrates Wd in FIGS. 6A and 6E and the processing substrates Wp in FIGS. 6B and 6D, and a wide central slit 31*tc* is disposed at the height position of the processing substrate Wp in FIG. 6C.

As illustrated in FIGS. 6A, 6B, 6D, and 6E, in the dummy substrates Wd on the uppermost and lowermost stages of the boat 80 and the processing substrates Wp disposed on the uppermost and lowermost stages among the plurality of processing substrates Wp, the same phenomenon as that in FIGS. 5A, 5B, 5D, and 5E described above occurs.

Figure 6A:
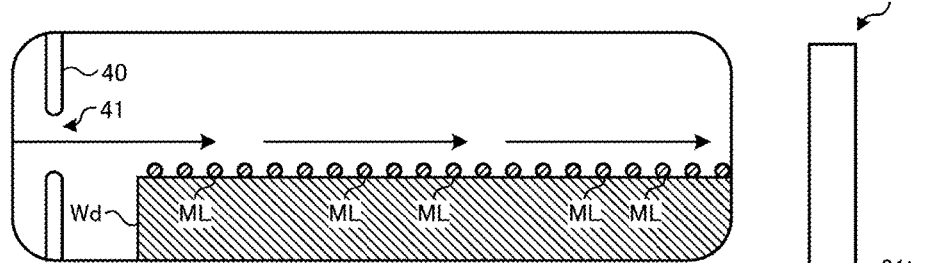
FIGS. 6A to 6E are schematic views illustrating a state of a film formation process in the substrate processing apparatus according to the embodiment.
Figure 6B:
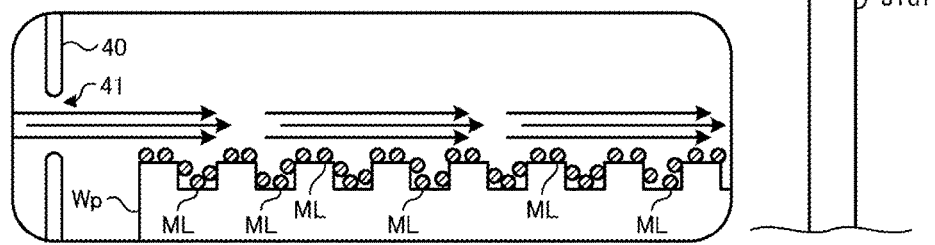
Figure 6C:
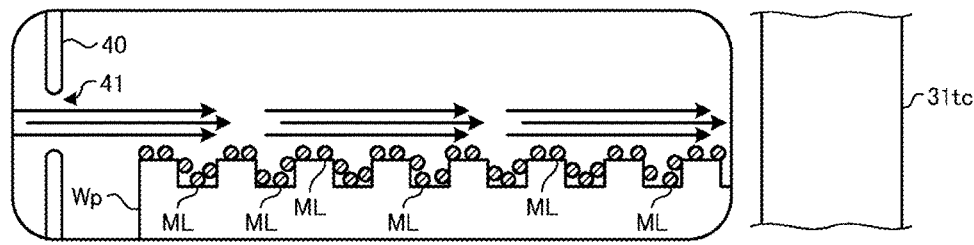
Figure 6D:
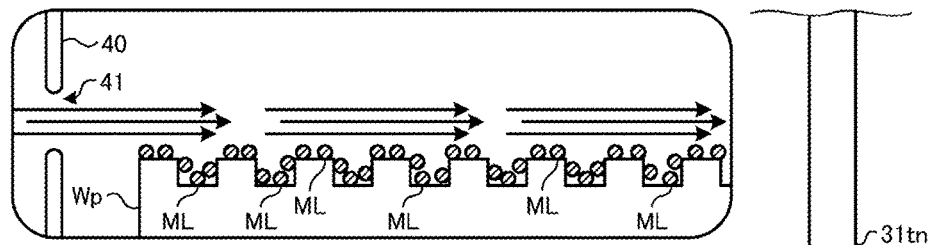
Figure 6E:
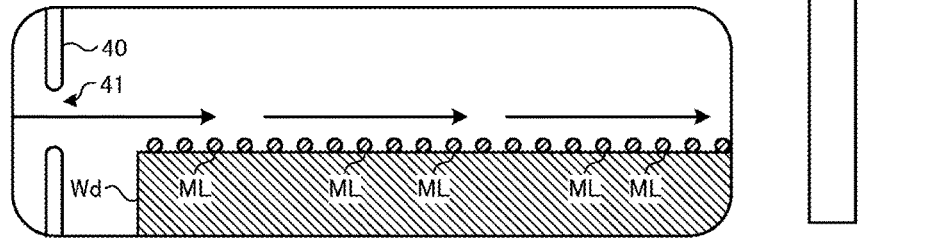

That is, the processing gas that is not consumed by the dummy substrates Wd having a small surface area in FIGS. 6A and 6E is supplied to the processing substrates Wp in FIGS. 6B and 6D, and the film thickness of the predetermined film in the processing substrate Wp is increased.

As illustrated in FIG. 6C, the central vicinity of the boat 80 corresponds to the height position of the wide central slit 31*tc* of the slit 31*a*, and as in FIGS. 6A, 6B, 6D, and 6E, a larger amount of the processing gas than the position corresponding to the narrow end slit 31*tn* is drawn from the nozzle 40 toward the slit 31*a*. For this reason, the efficiency of supplying the processing gas to the processing substrate Wp in FIG. 6C is increased.

Accordingly, the plurality of processing substrates Wp are loaded in multiple stages, and even in the central vicinity of the boat 80 where the consumed amount of processing gas by each processing substrate Wp increases due to the pattern of irregularities formed on the surface, for example, it is possible to increase the film thickness of the predetermined film in the processing substrate Wp illustrated in FIG. 6C as compared with the processing substrate Wp' illustrated in FIG. 5C described above.

Figure 7:
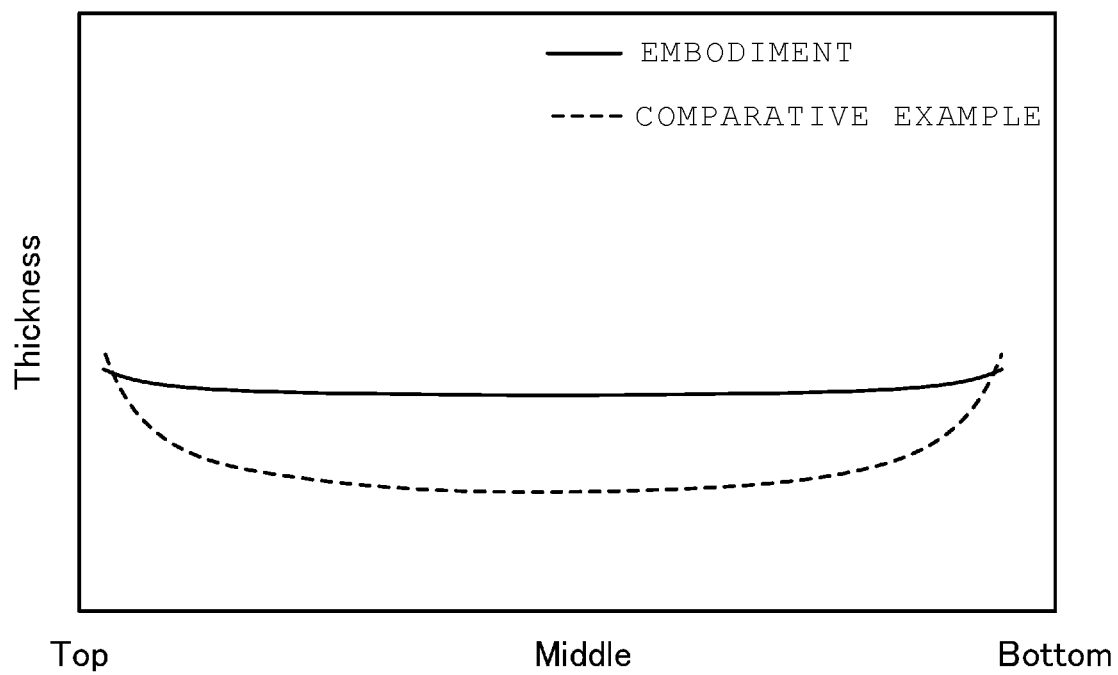
FIG. 7 is a graph schematically illustrating a film thickness of a predetermined film in a plurality of processing substrates subjected to processing according to the embodiment and a plurality of processing substrates subjected to processing according to the comparative example.

FIG. 7 is a graph schematically illustrating a film thickness of a predetermined film in a plurality of processing substrates Wp subjected to processing according to the embodiment and a plurality of processing substrates Wp' subjected to processing according to the comparative example. The horizontal axis of the graph is a disposition position of each of the processing substrates Wp and Wp' in the boat, and the vertical axis of the graph is a film thickness of the predetermined film formed on each of the processing substrates Wp and Wp'.

In the processing substrate Wp' of the comparative example illustrated by the broken line, the film thickness of the predetermined film in the vicinity of the upper stage (Top) and the lower stage (Bottom) of the boat becomes larger than that in the vicinity of the middle stage (Middle) of the boat, and the film thickness uniformity of the predetermined film in the entire processing substrate Wp' is deteriorated.

On the other hand, in the processing substrate Wp of the embodiment illustrated by the solid line, the film thickness of the predetermined film in the vicinity of the middle stage of the boat 80 is increased, and the film thickness is substantially the same as that of the predetermined films in the vicinity of the upper and lower stages of the boat 80. As described above, it is considered that this is because the efficiency of supplying the processing gas to the central vicinity of the boat 80 is improved by the slit 31*a* in which the opening area at the central portion in the stretching direction is larger than the opening areas at both end portions in the stretching direction. Accordingly, the film thickness uniformity of the predetermined film in the entire processing substrate Wp of the embodiment is improved.

According to the substrate processing apparatus 1 of the embodiment, the opening area of the slit 31 provided in the inner tube 30 at the central portion in the stretching direction is larger than the opening area at both end portions in the stretching direction. Thereby, the film thickness uniformity between the processing substrates Wp of the predetermined film formed on the processing substrate Wp can be improved.

It is noted that the substrate processing apparatus 1 according to the above-described embodiment has the furnace (the outer tube 10 and the inner tube 30) being stretched in the vertical direction and is configured as a vertical type furnace in which the processing substrate Wp is loaded in multiple stages. However, the configuration of the slit 31 and the substrate processing method according to the embodiment can be applied to a horizontal type furnace which has a furnace stretching in the horizontal direction and in which the processing substrates are arranged horizontally side by side.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing apparatus comprising:
   an inner tube extending in a first direction and configured to accommodate a plurality of substrates;
   an outer tube configured to surround the inner tube and provide an airtight sealed space;
   a nozzle disposed in the inner tube;
   a gas supply configured to supply a processing gas to the inner tube via the nozzle;
   at least one slit provided on a side surface of the inner tube facing the nozzle; and
   an exhaust port coupled to the outer tube,
   wherein, along the first direction, an opening area of a central portion of the slit is larger than an opening area of each of end portions of the slit.

2. The substrate processing apparatus according to claim 1, wherein the inner tube further accommodates a substrate holder configured to accommodate: (a) the plurality of processing substrates arranged in parallel and along the first direction, and (b) a plurality of dummy substrates disposed next to end-positioned ones of the plurality of processing substrates.

3. The substrate processing apparatus according to claim 2, wherein the substrate holder is made of quartz.

4. The substrate processing apparatus according to claim 1, wherein a width of the slit in the central portion in a second direction perpendicular to the first direction is larger than a width of the slit at the end portion in the second direction.

5. The substrate processing apparatus according to claim 1, wherein the at least one slit includes:
   a main slit extending in the first direction of the inner tube; and
   at least one sub slit disposed next to the main slit along a second direction perpendicular to the first direction.

6. The substrate processing apparatus according to claim 5, wherein the main slit is longer than the sub slit along the first direction.

7. The substrate processing apparatus according to claim 1, wherein the central portion and one of the end portions collectively have a step profile.

8. The substrate processing apparatus according to claim 1, wherein the central portion and one of the end portions collectively have a curvature profile.

9. The substrate processing apparatus according to claim 1, wherein the nozzle includes a plurality of holes arranged along the first direction, the plurality of holes corresponding to positions of the plurality of substrates, respectively.

10. The substrate processing apparatus according to claim 9, wherein the plurality of holes are disposed opposite the plurality of substrates from the slit.

11. A method for manufacturing a semiconductor device, the method comprising:
   arranging a plurality of processing substrates in parallel in an inner tube disposed in an outer tube, wherein the outer tube provides an enclosed airtight sealed space;
   supplying a processing gas into the inner tube via a nozzle; and
   exhausting the processing gas from a slit provided on a side surface of the inner tube facing the nozzle, wherein an opening area of a central portion of the slit is larger than an opening area of each of end portions of the slit.

12. The method according to claim 11, wherein the outer tube includes an exhaust port.

13. The method according to claim 11, wherein arranging a plurality of processing substrates in parallel in an inner tube further comprises arranging one or more dummy substrates next to end-positioned ones of the plurality of processing substrates, respectively.

14. The method according to claim 11, wherein the slit includes:
   a main slit extending in a longitudinal direction of the inner tube; and
   at least one sub slit disposed next to the main slit along another direction perpendicular to the longitudinal direction.

15. The method according to claim 11, wherein the nozzle includes a plurality of holes arranged along the first direction, the plurality of holes corresponding to positions of the plurality of substrates, respectively.

16. The method according to claim 15, wherein supplying a processing gas into the inner tube via a nozzle further includes flowing the processing gas from the plurality of holes into the inner tube.

* * * * *